United States Patent [19]

Itaya et al.

[11] Patent Number: 5,321,712
[45] Date of Patent: Jun. 14, 1994

[54] SEMICONDUCTOR LIGHT-EMITTING DEVICE HAVING A CLADDING LAYER COMPOSED OF AN INGAALP-BASED COMPOUND

[75] Inventors: Kazuhiko Itaya; Koichi Nitta; Genichi Hatakoshi, all of Yokohama; Yukie Nishikawa, Narashino; Hideto Sugawara, Kawasaki; Mariko Suzuki, Yokohama, all of Japan

[73] Assignee: Kabushiki Kaisha Toshiba, Kawasaki, Japan

[21] Appl. No.: 10,844

[22] Filed: Jan. 29, 1993

[30] Foreign Application Priority Data

Jan. 31, 1992 [JP] Japan .................................. 4-16932

[51] Int. Cl.$^5$ .............................................. H01S 3/19
[52] U.S. Cl. ...................................... 372/43; 372/45; 372/46
[58] Field of Search ............................. 372/43, 45, 46

[56] References Cited

U.S. PATENT DOCUMENTS

| | | | |
|---|---|---|---|
| 4,569,721 | 2/1986 | Hayakawa et al. | 156/649 |
| 4,819,036 | 4/1989 | Kuroda et al. | 357/4 |
| 4,949,349 | 8/1990 | Ohba et al. | 372/45 |
| 5,023,880 | 6/1991 | Suzuki et al. | 372/45 |
| 5,065,404 | 11/1991 | Okajima et al. | 372/45 |

FOREIGN PATENT DOCUMENTS

| | | |
|---|---|---|
| 0328393 | 8/1989 | European Pat. Off. . |
| 2628575 | 9/1989 | France . |
| 319718 | 3/1991 | Japan . |

OTHER PUBLICATIONS

Conference Digest of 12th IEEE International Semiconductor Laser Conference, Sep. 14, 1990, pp. 44–45, T. Ijichi, et al., "High Power CW Operation of Aluminum . . .
Conference Digest of 12th IEEE International Semiconductor Laser Conference, Sep. 14, 1990, pp. 152–153, J. N. Walpole, et al., "Improved Mass-Transported . . .
Japanese Journal of Applied Physics, vol. 31, No. 2A, Feb. 1, 1992, pp. L95–L98, I. Suemune et al., "Theoretical Estimation of Leakage Current in II–VI Heterostructure Lasers
Applied Physics Letters, vol. 57, No. 25, Dec. 17, 1990, pp. 2698–2700, C. T. H. F. Liedenbaum et al., "Determination of the GaInP/AlGaInP Band Offset
Applied Physics Letters, vol. 58, No. 7, Feb. 18, 1991, pp. 744–746, Jianhui Chen, et al., "Band Offset of GaAs-/In$_{0.48}$Ga$_{0.52}$P Measured Under Hydrostatic Pressure
Applied Physics Letters, vol. 56, No. 4, Jan. 22, 1990, pp. 312–314, S. H. Groves, et al., "GaInP Mass Transport and GaInP/GaAs Burried-Heterostructures Lasers
Patent Abstracts of Japan, vol. 10, No. 16 (E-375)(2073), Jan. 22, 1986, JP-A-60 178 684.

*Primary Examiner*—John D. Lee
*Assistant Examiner*—Hemang Sanghavi
*Attorney, Agent, or Firm*—Oblon, Spivak, McClelland, Maier & Neustadt

[57] ABSTRACT

A semiconductor light-emitting element includes a semiconductor substrate of a first conductivity type, a lower cladding layer formed on the semiconductor substrate and constituted by an InGaAlP-based compound of the first conductivity type, an active layer formed on the lower cladding layer, and constituted by a material selected from the group consisting of GaAs, GaAlAs, and InGaAs, and an upper cladding layer formed on the active layer, and constituted by the InGaAlP-based compound of a second conductivity type, wherein the InGaAlP-based compound is represented by a formula In$_y$(Ga$_{1-x}$Al$_x$)$_y$P, where x is in the range of 0.3 to 0.7 and y is in the range of 0.45 to 0.55.

30 Claims, 8 Drawing Sheets

SEMICONDUCTOR LIGHT-EMITTING DEVICE HAVING A CLADDING LAYER COMPOSED OF AN INGAALP-BASED COMPOUND

BACKGROUND OF THE INVENTION

1. Field of the Invention

The present invention relates to a semiconductor light-emitting device using a compound semiconductor material and, more particularly, to a semiconductor light-emitting element, e.g., a semiconductor laser, having a sufficiently large band gap between an active layer and a cladding layer.

2. Description of the Related Art

Recently, development in semiconductor lasers has been aimed at an application of an optical information processing optical source, e.g., an optical disk system and a high-speed laser printer. Especially, a GaAlAs-based semiconductor laser in which an active layer is constituted by GaAs and a cladding layer is constituted by GaAlAs and which has an oscillation wavelength in a 0.8 μm wavelength band is under development as a promising semiconductor laser. Some of such semiconductor lasers already have high reliability and have been put into practical use.

However, the GaAlAs-based semiconductor laser does not necessarily have sufficiently good temperature characteristics when it is used in an automobile, or operated in a severe atmosphere or with a high output. For this reason, limitations such as use at a temperature of 100° C. or less are imposed.

In order to solve these problems, it is effective to increase the band gap difference between the active and cladding layers. For example, the Al atomic ratio x of $Ga_{1-x}Al_xAs$, which is usually 0.4, is increased to 0.8 or more. However, problems still arise such that impurity doping becomes difficult, or transition contributing to electric conduction becomes indirect X transition having a small band gap change with respect to the Al atomic ratio. Hence, the Al atomic ratio cannot be increased.

In this manner, in the conventional GaAlAs-based semiconductor laser, the band gap difference between the active and cladding layers cannot be sufficiently increased, and the semiconductor laser is limited to the operation at a temperature of 100° C. or less.

SUMMARY OF THE INVENTION

It is an object of the present invention to provide a semiconductor light-emitting element having improved temperature characteristics and capable of oscillation at an ultra-high temperature.

It is another object of the present invention to provide a semiconductor light-emitting element whose element voltage can be decreased.

According to the first aspect of the present invention, there is provided a semiconductor light-emitting element comprising:

a semiconductor substrate having a first conductivity type;

a lower cladding layer formed on the semiconductor substrate, and constituted by an InGaAlP-based compound having the first conductivity type;

an active layer formed on the lower cladding layer, and constituted by a material selected from the group consisting of GaAs, GaAlAs, and InGaAs; and an upper cladding layer formed on the active layer, and constituted by the InGaAlP-based compound having a second conductivity type.

According to the second aspect of the present invention, there is provided a semiconductor light-emitting element comprising:

a compound semiconductor substrate;

a double-hetero structure formed on the semiconductor substrate, and constituted by a first cladding layer having a first conductivity type, a second cladding layer having a second conductivity type, and an active layer having the first conductivity type interposed between the first and second cladding layers;

wherein the active layer and the first and second cladding layers are constituted by such a combination of materials that a valence band difference between the active layer and at least one of the first and second cladding layers is larger than a conduction band difference therebetween.

According to the third aspect of the present invention, there is provided a semiconductor light-emitting element comprising:

a compound semiconductor substrate;

a double-hetero structure formed on the semiconductor substrate, and constituted by a first cladding layer having a first conductivity type, a second cladding layer having a second conductivity type, and an active layer having the first conductivity type interposed between the first and second cladding layers;

wherein the active layer and the first and second cladding layers are constituted by such a combination of materials that a valence band difference between the active layer and at least one of the first and second cladding layers is larger than a conduction band difference therebetween, and an intermediate band gap layer is interposed between the active and second cladding layers, the intermediate band gap layer having an intermediate band gap of band gaps of the active and second cladding layers, or an intermediate band gap layer is interposed between the active and second cladding layers, the intermediate band gap layer having an intermediate band gap of band gaps of the active and second cladding layers, and an intermediate band gap layer is interposed between the active and first cladding layers, the intermediate band gap layer having an intermediate band gap of band gaps of the active and first cladding layers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The gist of the present invention is that the band gap difference between the active and cladding layers is increased, that a material system capable of providing good light-emitting characteristics is chosen, and that a structure that lowers the heterobarriers formed between the active and cladding layers when such a material system is used is realized.

More specifically, in a semiconductor light-emitting device according to the first embodiment of the present invention, the active layer is constituted by GaAs, GaAlAs, or InGaAs, and the cladding layers are constituted by an InGaAlP-based compound. The InGaAlP-based compound constituting the cladding layers is represented by a chemical formula $In_y(Ga_{1-x}Al_x)_yP$ wherein x is 0.3 to 0.7 and preferably 0.5 to 0.7 and y is 0.45 to 0.55 and preferably 0.49 to 0.52. If x is less than 0.3, the band gap difference between each cladding layer and the active layer cannot be increased; if x exceeds 0.7, then doping control of p-type impurity becomes difficult, which is not preferable.

In the first embodiment of the present invention, when x in the chemical formula $In_y(Ga_{1-x}Al_x)_yP$ is set to 0.3 or more, the band gap difference between each cladding layer and the active layer can be increased to 0.7 eV or more. Then, a semiconductor light-emitting element capable of operating in a high temperature range exceeding 300° C. and having a small operating current can be obtained. Since an InGaAlP-based compound is lattice-matched with GaAs, crystal growth using a material system of this type can be realized in accordance with MOCVD or the like.

A semiconductor light-emitting device according to the second embodiment of the present invention has a double heterojunction structure in which an active layer is sandwiched between p- and n-type cladding layers having different nonmetallic elements from that of the active layer. The active and cladding layers are combined such that at least half of the band incontinuous values are distributed to the valence band. The conductivity type of the active layer is the n type. Such a combination of the active and cladding layers can have the active layer constituted by, e.g., GaAs, GaAlAs, or InGaAs, and the cladding layers constituted by an InGaAlP-based material system represented by the formula described above.

When the band gap difference between the active layer and each cladding layer is increased according to the first embodiment of the present invention, hole injection from the p-type cladding layer to the active layer can be undesirably interfered with by the presence of the heterobarrier based on the band gap difference, and the device voltage can be increased.

In contrast to this, according to the second embodiment of the present invention, since the active layer is an n-type layer, even if the band gap difference between the active layer and each cladding layer is large, hole injection from the p-type cladding layer to the active layer is performed in a recombination state through the p-n junction. Therefore, the heterobarrier against the holes can be effectively lowered by the bend of the band in the p-n junction, so that hole injection from the p-type cladding layer to the active layer can be smoothly performed.

A semiconductor light-emitting device according to the third embodiment of the present invention has a double heterojunction structure in which an active layer is sandwiched between p- and n-type cladding layers. Between active and p-type cladding layers, an intermediate band gap layer having an intermediate band gap of the band gaps of the active and p-type cladding layers is interposed. Alternatively, between the active and p-type cladding layers, an intermediate band gap layer having an intermediate band gap of the band gaps of the active and p-type cladding layers is interposed, and between the active and n-type cladding layers, an intermediate band gap layer having an intermediate band gap of the band gaps of the active and n-type cladding layers is interposed. These intermediate band gap layers can be constituted by, e.g., a material represented by $In_pGa_{1-p}P$ (p:0.3-0.7).

In this manner, when a layer having an intermediate band gap of the band gaps of the p-type cladding and active layers is interposed between the p-type cladding and active layers, the heterobarrier can be effectively lowered, and hole injection from the p-type cladding layer to the active layer can be smoothly performed. Therefore, an increase in element voltage caused by the presence of the heterobarrier can be prevented.

Various preferred embodiments of the present invention will be described with reference to the accompanying drawings.

Figure 1:
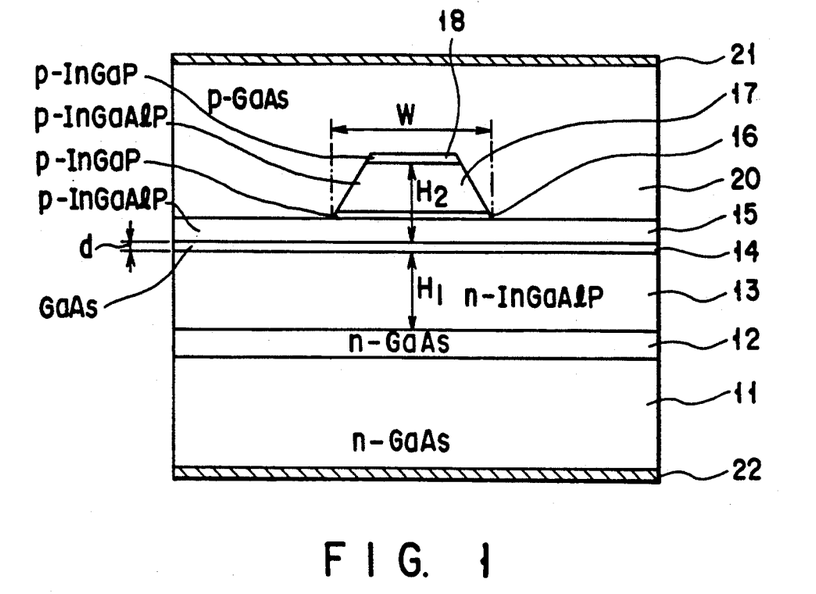
FIG. 1 is a sectional view schematically showing the structure of a semiconductor laser according to the first embodiment of the present invention.

FIG. 1 is a sectional view showing the schematic structure of a semiconductor layer according to the first example of the present invention. Referring to FIG. 1, reference numeral 11 denotes an n-type GaAs substrate on which an n-type GaAs buffer layer 12 is formed. A double heterojunction structure constituted by the following layers is formed on the buffer layer 12.

(a) a lower cladding layer 13 constituted by n-type $In_{0.5}(Ga_{0.3}Al_{0.7})_{0.5}P$ (Si-doped, 3 to $5 \times 10^{17}$ cm$^{-3}$)

(b) an active layer 14 constituted by GaAs (non-doped)

(c) a first upper cladding layer 15 constituted by p-type $In_{0.5}(Ga_{0.3}Al_{0.7})_{0.5}P$ (Zn-doped, 3 to $5 \times 10^{17}$ cm$^{-3}$)

(d) an etching stopper layer 16 constituted by p-type $In_{0.5}Ga_{0.5}P$ (Zn-doped, 3 to $5\times10^{17}$ cm$^{-3}$)

(e) a second upper cladding layer 17 constituted by p-type $In_{0.5}(Ga_{0.3}Al_{0.7})_{0.5}P$ (Zn-doped, 3 to $5\times10^{17}$ cm$^{-3}$)

The second upper cladding layer 17 is formed to have a stripe or ridge shape, and a capping layer 18 (Zn-doped, $1\times10^{17}$ cm$^{-3}$) constituted by p-type $In_{0.5}Ga_{0.5}P$ is formed on the second upper cladding layer 17.

The atomic ratios of In, Ga, and Al are determined such that the lattice constants of the respective layers 13 to 17 constituting the double heterojunction and that of the capping layer 18 are equal to that of the GaAs substrate 11 and that the band gap energies of the lower cladding layer 13 and the first upper cladding layer 15 are higher than that of the active layer 14.

A contact layer 20 (Zn-doped, $5\times10^{18}$ cm$^{-3}$) constituted by p-type GaAs is formed on the side portions of the second upper cladding layer 17 and on the capping layer 18. A p-type side electrode 21 is formed on the upper surface of the contact layer 20, and an n-type side electrode 22 is formed on the lower surface of the substrate 11. Note that all the layers excluding the p- and n-type side electrodes 21 and 22 are formed in accordance with Metal Organic Chemical Vapor Deposition (MOCVD).

Current narrowing in the semiconductor laser described above shown in FIG. 1 is performed by utilizing a difference in voltage drop between the p-type InGaAlP/p-type GaAs heterojunction and the p-type InGaAlP/p-type InGaP/p-type GaAs heterojunction (when a p-type InGaP layer having an intermediate band gap is sandwiched, the barrier is lowered, and the voltage drop can be decreased). That is, the capping layer 18 constituted by p-type InGaP is provided only at the ridge portion, thereby, narrowing the current.

An optical waveguide is formed by the first and second upper cladding layers 15 and 17. A thickness $H_1$ of the lower cladding layer 13 is 1.0 μm, a thickness d of the active layer 14 is 0.04 μm, a total thickness $H_2$ of the first and second upper cladding layers 15 and 17 at the ridge portion through the etching stopper layer 16 is 1.0 μm, the thickness of the etching stopper layer 16 is 0.01 μm, and a width W of the bottom portion of the mesa portion is 5 μm. Note that the buffer layer 12 is required to improve the quality of the InGaAlP-based crystal formed on the GaAs substrate 11 and is not always needed.

In order to obtain a laser having a small overflow and excellent temperature characteristics, the structure parameters, especially the composition of each cladding layer in this case, must be set to fall within a predetermined range, and the enumerated values are examples. Optimization of the composition (Al atomic ratio) of the cladding layer will be described.

In order to oscillate a semiconductor laser at room temperature and to operate it up to a temperature near 100° C., it is known that the band gap difference between the active and cladding layers must be 350 meV or more. Assuming that the factor of overflow caused by thermal turbulence from the active layer to the cladding layer is the Maxwell-Boltzmann distribution, i.e., $\exp(-\Delta E/kT)$, when the operation up to the range exceeding 300° C. is considered, a band gap difference of 700 meV which is almost twice that described above is needed.

Figure 2:
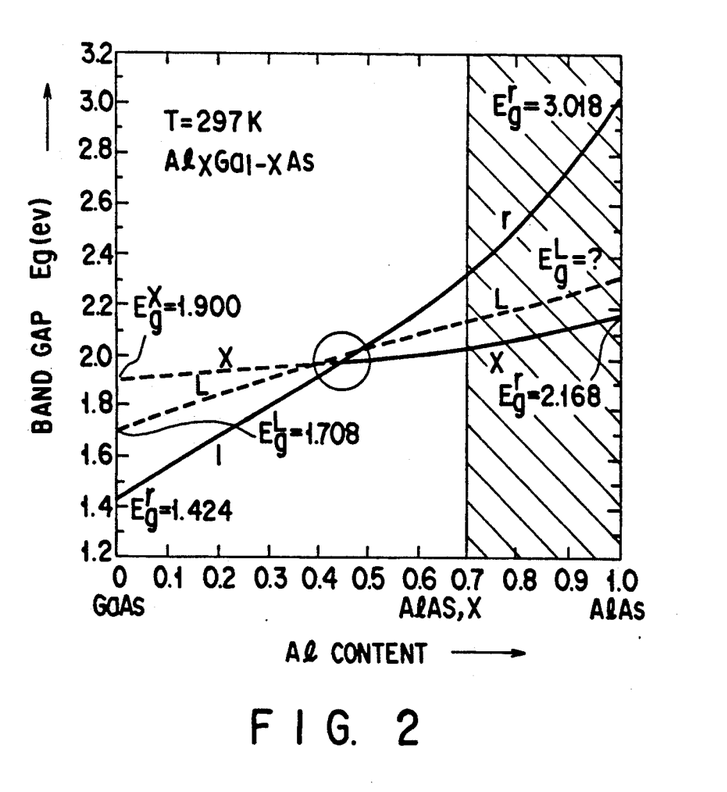
FIG. 2 is a graph showing the relationship between the Al atomic ratio and the band gap of GaAlAs constituting the cladding layer of a conventional semiconductor laser.

FIG. 2 is a graph showing the relationship between the Al atomic ratio and the band gap of the GaAlAs-based material. Referring to the graph of FIG. 2, the hatched portion represents a region where doping is difficult. When the active layer is constituted by GaAs, the band gap of the cladding layer must be 2.1 eV or more. The Al atomic ratio of GaAlAs corresponding to this value is 0.8 or more, as shown in FIG. 2. However, this value falls in the region where doping is difficult, and problems, e.g., an increase in element resistance and degradation in reliability are caused. For this reason, when GaAlAs is adopted as the material of the cladding layer, it is difficult to realize the above band gap difference.

Figure 3:
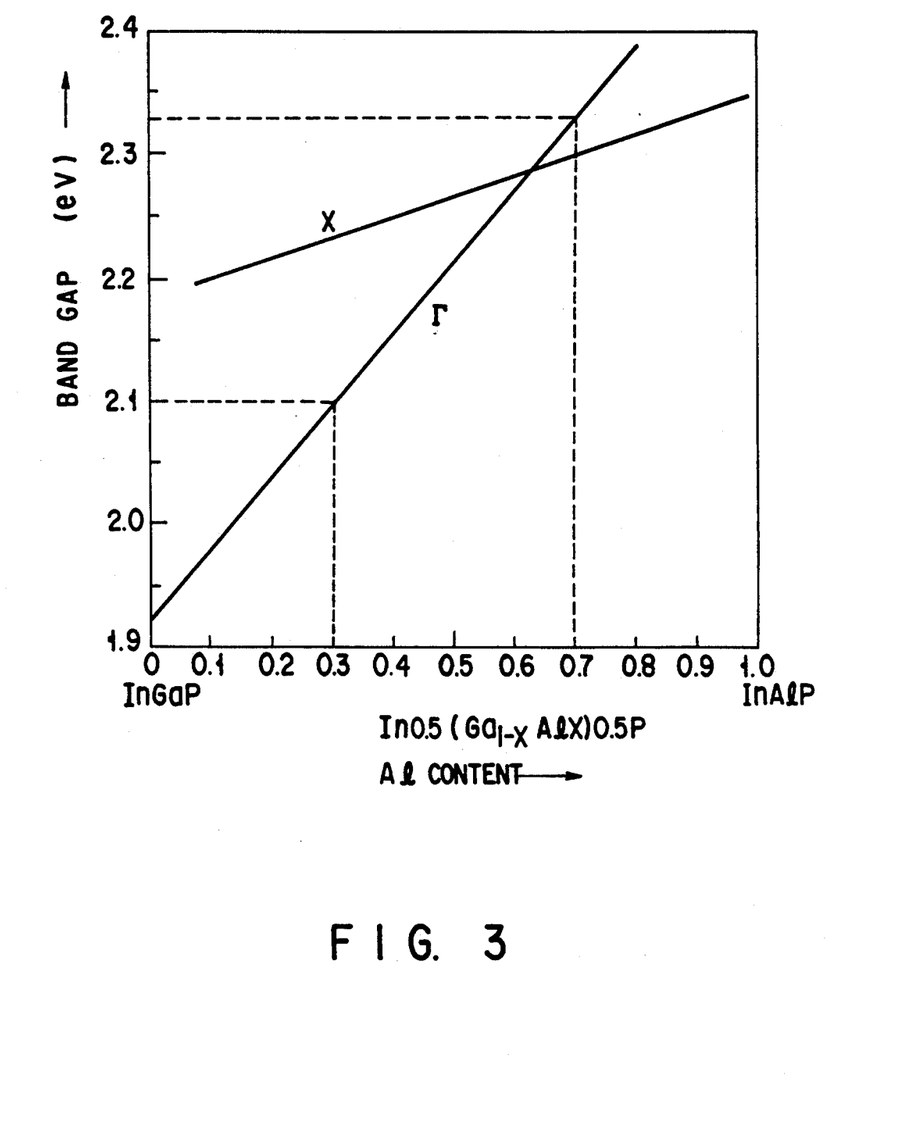
FIG. 3 is a graph showing the relationship between the Al atomic ratio and the band gap of InGaAlP constituting the cladding layer of the semiconductor laser shown in FIG. 1.

FIG. 3 is a graph showing the relationship between the Al atomic ratio and the band gap of the InGaAlP-based material. As shown in FIG. 3, when the Al atomic ratio is set to 0.3 or more, a band gap of 2.1 eV can be obtained. When the Al atomic ratio is up to 0.7, Γ transition is dominant, and the band gap can be increased with a good linearity with respect to the Al atomic ratio. When the Al atomic ratio is 0.7, a band gap of 2.3 eV or more can be obtained.

Figure 4:
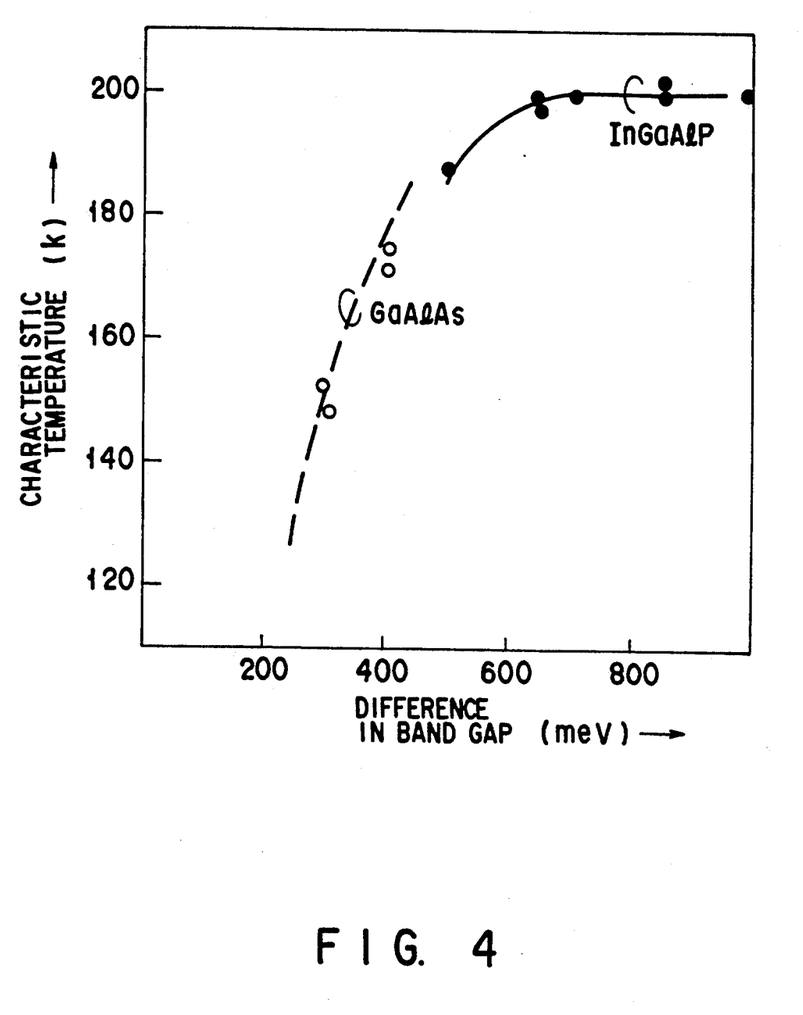
FIG. 4 is a graph showing the relationship between the band gap difference between the active and cladding layers and a characteristic temperature.

FIG. 4 is a graph showing the relationship between the band gap difference between the GaAs active and cladding layers and a characteristic temperature ($T_0$) at a temperature of 100° C.. The broken curve represents a case wherein the cladding layer is constituted by GaAlAs, and the solid curve represents a case wherein the cladding layer is constituted by InGaAlP. The dependency of the characteristic temperature on the band gap difference is different between the GaAlAs cladding layer and the InGaAl cladding layer due to the different band incontinuous relationships of GaAlAs and InGaAlP with GaAs. When the band gap is the same, InGaAlP has a slightly low characteristic temperature. However, when the Al composition ratio is set to 0.3 or more, a characteristic temperature ($T_0$) that cannot be achieved with GaAlAs can be obtained.

When the active layer is constituted by GaAlAs, since the band gap of the active layer tends to be increased, the Al atomic ratio of the cladding layer is also preferably increased. When the active layer is constituted by InGaAs, although the band gap difference tends to be increased, factors, e.g., Auger recombination, that degrade the temperature characteristics are also increased in the InGaAs light-emitting process. Therefore, the Al atomic ratio of the InGaAlP cladding layer is preferably 0.3 or more.

In this manner, the semiconductor laser shown in FIG. 1, in which the Al atomic ratio of the cladding layer is set to fall within the predetermined range, continuously oscillated at an oscillation threshold current ($I_{th}$) of 32 mA when the resonator length was 400 μm. The characteristic temperature ($T_0$) did not change up to a temperature (T) of 200° C. and was 190 K, which substantially coincided with the value determined by the temperature dependency of the gain of the active layer. This indicates that overflow of carriers injected from the active layer to the cladding layer is suppressed as designed. As a result, continuous oscillation was observed at a temperature up to 270° C., and pulse oscillation was observed at a temperature up to 320° C..

Regarding a high-output operation, according to the semiconductor laser in which asymmetric coating was performed, a maximum optical output of 50 mW was obtained. Regarding reliability, a stable operation of 1,000 hours or more was observed at 80° C. and 30 mW. In these results, no problem due to the As-based active layer and the P-based cladding layer was observed. It is estimated that interface deposition switching is performed very well by MOCVD, and that continuous growth is performed.

Figure 11:
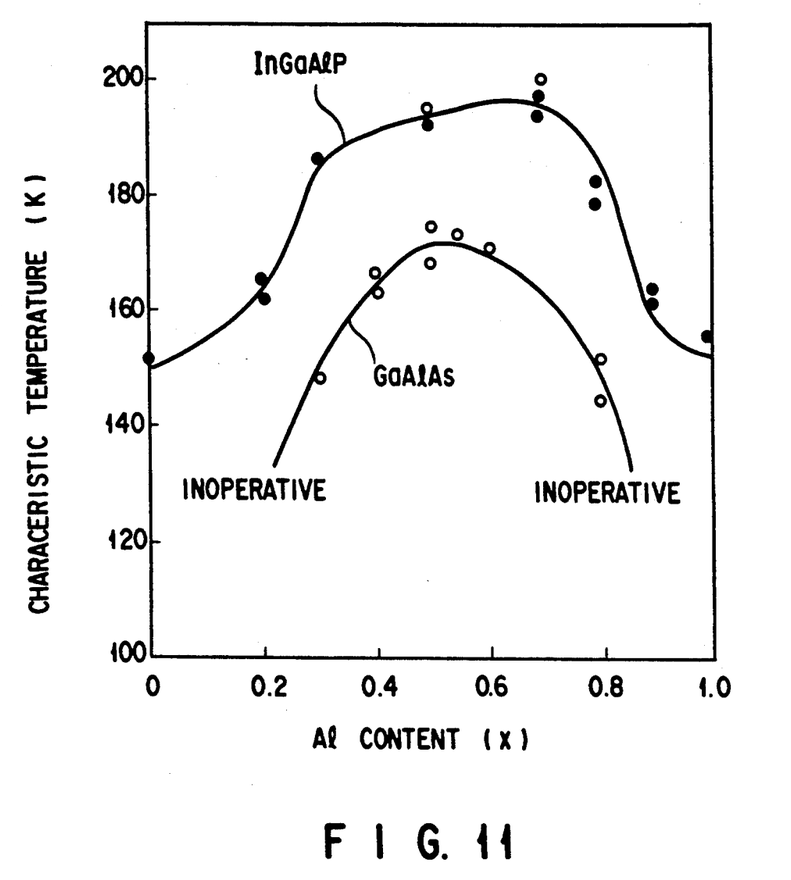
FIG. 11 is a graph showing the relationship between the Al atomic ratio and the characteristic temperature.

FIG. 11 is a graph showing the relationship between the Al atomic ratio of the cladding layer and the characteristics temperature of the semiconductor laser. As shown in FIG. 11, when the Al atomic ratio of InGaAlP constituting the cladding layer falls within the range of 0.3 to 0.7, high characteristic temperature can be obtained.

Figure 5:
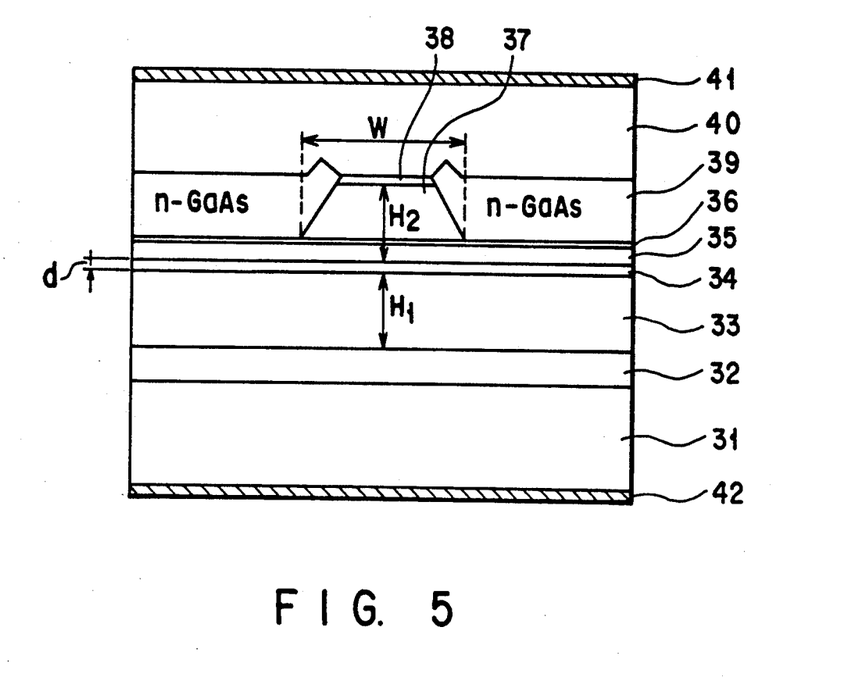
FIG. 5 is a sectional view schematically showing the structure of a semiconductor laser according to the second embodiment of the present invention.

FIG. 5 is a sectional view showing the schematic structure of a semiconductor laser according to the second example of the present invention.

Referring to FIG. 5, reference numeral 31 denotes an n-type GaAs substrate on which an n-type GaAs buffer layer 32 is formed. A double heterojunction structure constituted by the following layers is formed on the buffer layer 32.

(a) a lower cladding layer 33 constituted by n-type $In_{0.5}(Ga_{0.3}Al_{0.7})_{0.5}P$ (Si-doped, 3 to $5\times10^{17}$ cm$^{-3}$)

(b) an active layer 34 constituted by $Ga_{0.9}Al_{0.1}As$ (nondoped)

(c) a first upper cladding layer 35 constituted by p-type $In_{0.5}(Ga_{0.3}Al_{0.7})_{0.5}P$ (Zn-doped, 3 to $5\times10^{17}$ cm$^{-3}$)

(d) an etching stopper layer 36 constituted by p-type $In_{0.5}Ga_{0.5}P$ (Zn-doped, 3 to $5\times10^{17}$ cm$^{-3}$)

(e) a second upper cladding layer 37 constituted by p-type $In_{0.5}(Ga_{0.3}Al_{0.7})_{0.5}P$ (Zn-doped, 3 to $5\times10^{17}$ cm$^{-3}$)

The second upper cladding layer 37 is formed to have a stripe shape, and a capping layer 38 (Zn-doped, $1\times10^{18}$ cm$^{-3}$) constituted by p-type $In_{0.5}Ga_{0.5}P$ is formed on the second upper cladding layer 37.

An n-type GaAs current narrowing layer 39 is formed on each side portion of the second upper cladding layer 37, and a contact layer 40 (Zn-doped, $5\times10^{18}$ cm$^{-3}$) constituted by p-type GaAs is formed on the current narrowing layer 39 and the capping layer 38. A p-type electrode 41 is formed on the upper surface of the contact layer 40, and an n-type electrode 42 is formed on the lower surface of the substrate 31.

Optical waveguide is performed by the first and second upper cladding layers 35 and 37 having the stripe and mesa shapes, respectively, in a similar manner to that of the first example. A thickness $H_1$ of the lower cladding layer 33, a thickness d of the active layer 34, a total thickness $H_2$ of the first and second upper cladding layers 35 and 37 at the ridge portion through the etching stopper layer 36, the thickness of the etching stopper layer 36, and a width W of the bottom portion of the mesa portion were set to the same as those of the first example shown in FIG. 1.

In the semiconductor laser according to the second example, the band gap difference between the active and cladding layers can be sufficiently increased by using InGaAlP to constitute the cladding layers, in the same manner as in the first example. Continuous oscillation having an oscillation frequency of 780 nm was obtained at 200° C. or more.

Figure 6:
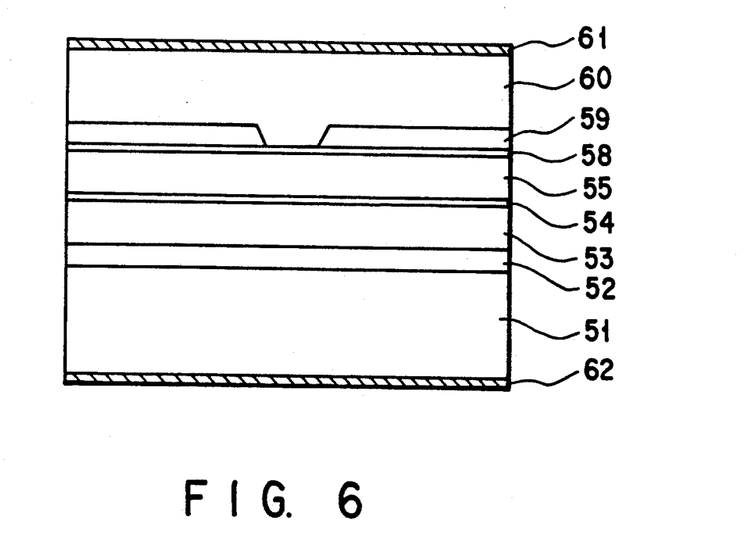
FIG. 6 is a sectional view schematically showing the structure of a semiconductor laser according to the third embodiment of the present invention.

FIG. 6 is a sectional view showing the schematic structure of a semiconductor layer according to the third example of the present invention. Referring to FIG. 6, reference numeral 51 denotes an n-type GaAs substrate on which a buffer layer 52 constituted by n-type GaAs is formed. A double heterojunction structure constituted by the following layers is formed on the buffer layer 52.

(a) a cladding layer 53 constituted by n-type $In_{0.5}(Ga_{0.3}Al_{0.7})_{0.5}P$ (Si-doped, 3 to $5\times10^{17}$ cm$^{-3}$)

(b) an active layer 54 constituted by $In_{0.05}Ga_{0.95}As$ (nondoped), a cladding layer 55 constituted by p-type $In_{0.5}(Ga_{0.3}Al_{0.7})_{0.5}P$ (Zn-doped, 3 to $5\times10^{17}$ cm$^{-3}$)

A capping layer 58 (Zn-doped, $1\times10^{18}$ cm$^{-3}$) constituted by p-type $In_{0.05}Ga_{0.5}P$ and a current narrowing layer 59 constituted by n-type GaAs and having a stripe opening are formed on the double heterojunction structure. A contact layer 60 (Zn-doped, $5\times10^{18}$ cm$^{-3}$) constituted by p-type GaAs is formed on the current narrowing layer 59 and the capping layer 58. A p-type electrode 61 is formed on the upper surface of the contact layer 60, and an n-type electrode 62 is formed on the lower surface of the substrate 51.

In the semiconductor laser according to the third example, the band gap difference between the active and cladding layers can be sufficiently increased by using InGaAlP to constitute the cladding layers, in the same manner as in the first example. Continuous oscillation having an oscillation frequency of 950 nm was obtained at 300° C. or more.

Figure 7:
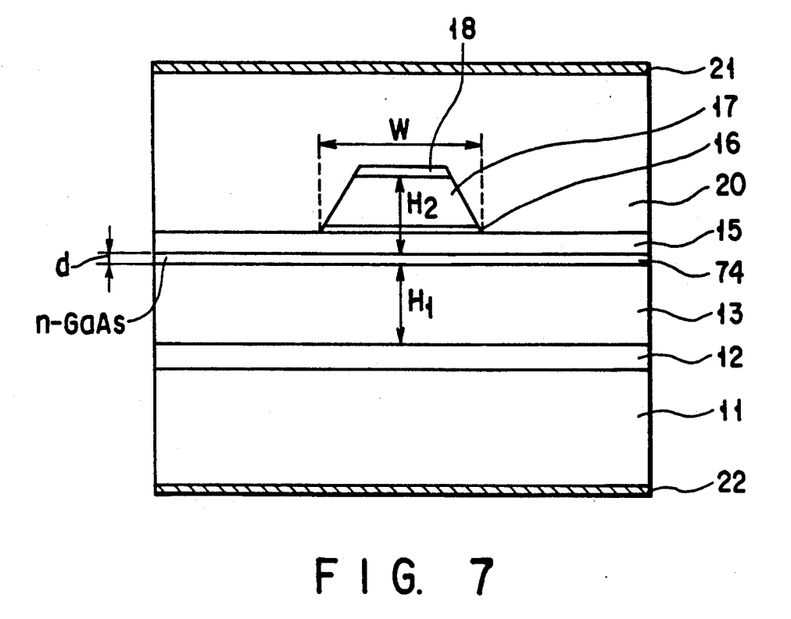
FIG. 7 is a sectional view schematically showing the structure of a semiconductor laser according to the fourth embodiment of the present invention.

FIG. 7 a sectional view schematically showing the structure of a semiconductor laser according to the fourth example of the present invention. The same portions as in FIG. 1 are denoted by the same reference numerals, and a detailed description thereof will be omitted.

The fourth example is different from the first example in that the active layer is an n-type layer. More specifically, in the structure same as that of FIG. 1, an active layer 74 is nondoped but has an n conductivity type. Conditions excluding this, e.g., the composition of the respective layers, the film thicknesses, and doses were set to the same as in the first embodiment.

In the first example described above, since the band gap difference between the active and cladding layers is increased, a heterobarrier based on the large band gap between GaAs and InGaAlP is formed. Hole injection from the p-type cladding layer to the active layer is interfered with by the presence of the heterobarrier, thus undesirably increasing the element voltage. Especially, when a large band discontinuity is present in the valence band, a large heterospike is caused. In addition, since a P-As interface having different Group V elements is formed, hole injection is interfered with, and degradation starting from the interface occurs. According to the fourth example, the conductivity type of the active layer is set to n type, thereby solving these problems.

The relationship between the conductivity type of the active layer and hole injection will be described.

Figure 8A:
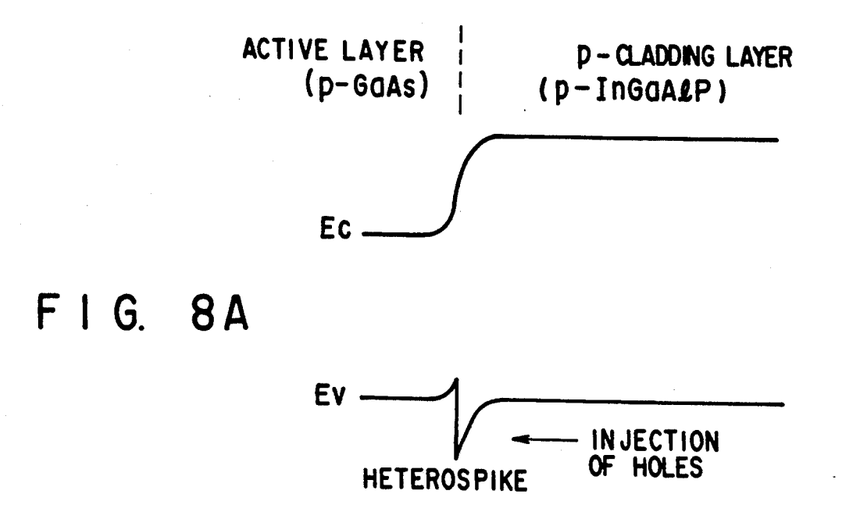
FIGS. 8A and 8B are schematic energy band diagrams of p- and n-type active layers with reference to a p-type cladding layer.
Figure 8B:
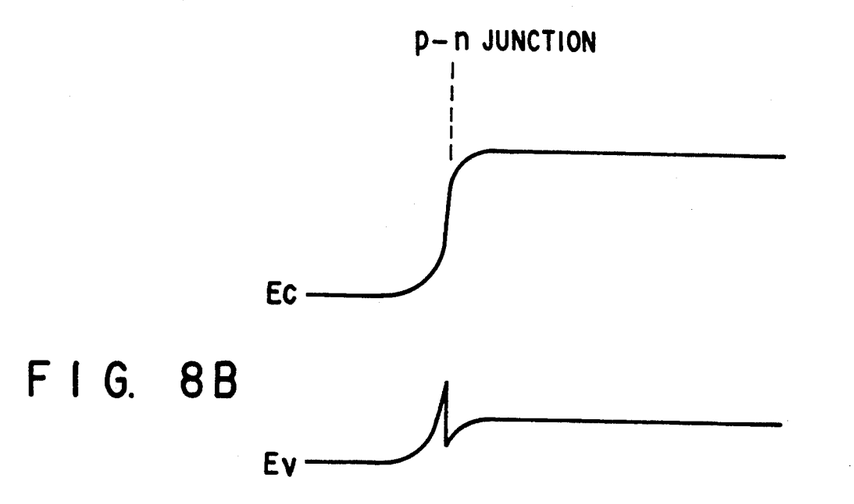

FIGS. 8A and 8B are energy band diagrams of p- and n-type active layers with reference to a p-type cladding layer. The bias is applied in the forward direction. As shown in FIG. 8A, when the active layer is of the p-type, a heterobarrier based on a large band gap difference appears to interfere with hole injection to the active layer, so that the rise voltage and resistance of the element are increased, considerably degrading the element characteristics. This tendency becomes conspicuous especially when the band gap difference between the active and cladding layers exceeds 0.7 eV, thus increasing the resistance of the element.

As shown in FIG. 8B, when the active layer is of the n type, a p-n junction is present between the active and cladding layers. In this case, because of the bend of the band having the depletion layer of the p-n junction as the center, the heterobarrier against the holes can be effectively lowered. For this reason, hole injection to the active layer is smoothly performed, and the heterobarrier does not interfere with hole injection. Although the relationship shown in the energy band diagrams of FIGS. 8A and 8B changes depending on the Al atomic ratios and the carrier concentrations of the respective layers, it is largely determined by the conductivity type of the active layer, as described above. Therefore, it is preferable that the conductivity type of the active layer is set to the n type.

In this manner, the semiconductor laser shown in FIG. 7, in which the active layer was set to the n type, continuously oscillated at a threshold current of 25 mA when the resonator length was 400 μm. The element resistance was 3 Ω, and the voltage was as low as 1.8 V even at 20 mW. The characteristic temperature did not change up to a temperature of 200° C. and was 205 K, which substantially coincided with the value determined by the temperature dependency of the gain of the active layer. This indicates that overflow of carriers injected from the active layer to the cladding layer is suppressed as designed.

As a result, continuous oscillation was observed at a temperature up to 280° C., and pulse oscillation was observed at a temperature up to 350° C. Regarding a high-output operation, according to the semiconductor laser in which asymmetric coating was performed, a maximum optical output of 65 mW was obtained. Regarding reliability, a stable operation of 3,000 hours or more was observed at 80° C. and 30 mW. In these results, no problem due to the As-based active layer and the P-based type cladding layer was observed. It is estimated that interface deposition switching is performed very well by MOCVD, and that continuous growth is performed.

The above-mentioned effects obtained by setting the active layer to the n type are not limited to the material system used in the respective examples, but appear when the nonmetallic elements of the active and cladding layers are different and the band discontinuity of the valence band, of the band discontinuities of the active layers and the p-based cladding layer (upper cladding layer), becomes large. Especially, when the heterojunction structure is designed such that at least half of the band discontinuity values are distributed to the valence band, the heterospike becomes excessively large, the holes are not injected to the active layers, and laser oscillation does not occur. In this case, when the active layer is set to the n type, as in this example, smooth hole injection from the P-based cladding layer (upper cladding layer) to the active layer is enabled. Also, the active layer is not necessarily of the n type. In some cases, even if the active layer is of the p type, as far as the carrier concentration of the active layer is 3 to $5 \times 10^{17}$ cm$^{-3}$, a similar improvement to that obtained when the active layer is of the n type can be obtained.

Figure 9:
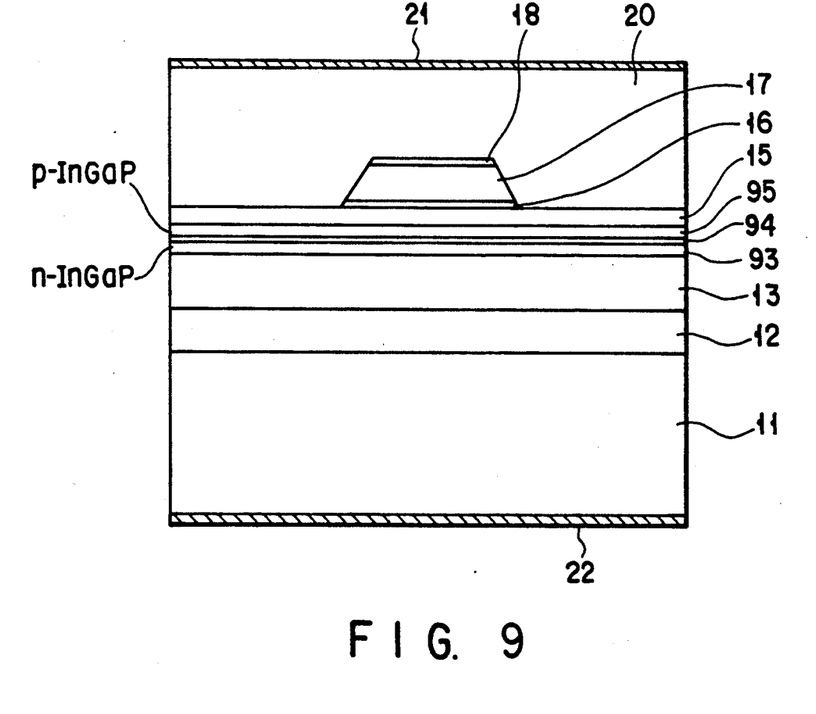
FIG. 9 is a sectional view schematically showing the structure of a semiconductor laser according to the fifth embodiment of the present invention.

FIG. 9 is a sectional view schematically showing the structure of a semiconductor laser according to the fifth example of the present invention. The same portions as in FIG. 1 are denoted by the same reference numerals, and a detailed description thereof will be omitted.

The fifth example is different from the first example in that, between an active layer 94 and a lower cladding layer 13, a layer having an intermediate band gap of the band gaps of the active and lower cladding layers 94 and 13 is provided, and between the active layer 94 and an upper cladding layer 15, a layer having an intermediate band gap of the band gaps of the active and upper cladding layers 94 and 15 is provided. More specifically, an optical guide layer 93 (Si-doped, 3 to $5 \times 10^{17}$ cm$^{-3}$) constituted by n-type In$_{0.5}$Ga$_{0.5}$P is provided between the active layer 94 and the n-type lower cladding layer 13, and an optical guide layer 95 (Zn-doped, 3 to $5 \times 10^{17}$ cm$^{-3}$) constituted by p-type In$_{0.5}$Ga$_{0.5}$ is provided between the active layer 94 and the upper cladding layer 15. The thickness of the active layer 94 was set to 0.03 μm, and other conditions, e.g., the thicknesses of other layers and the width of the bottom portion of the mesa portion, were set to the same as in the first embodiment.

In the fifth example, an increase in element voltage caused by the presence of the heterobarrier based on the band gap difference between the active and cladding layers is prevented, in the same manner as in the fourth example. In order to sufficiently decrease the element voltage, the element structure, especially the optical guide layer provided between the active layer and the p-type upper cladding layer and constituted by InGaP in this case, is significant. Hole injection to the InGaP and active layers will be described.

Figure 10A:
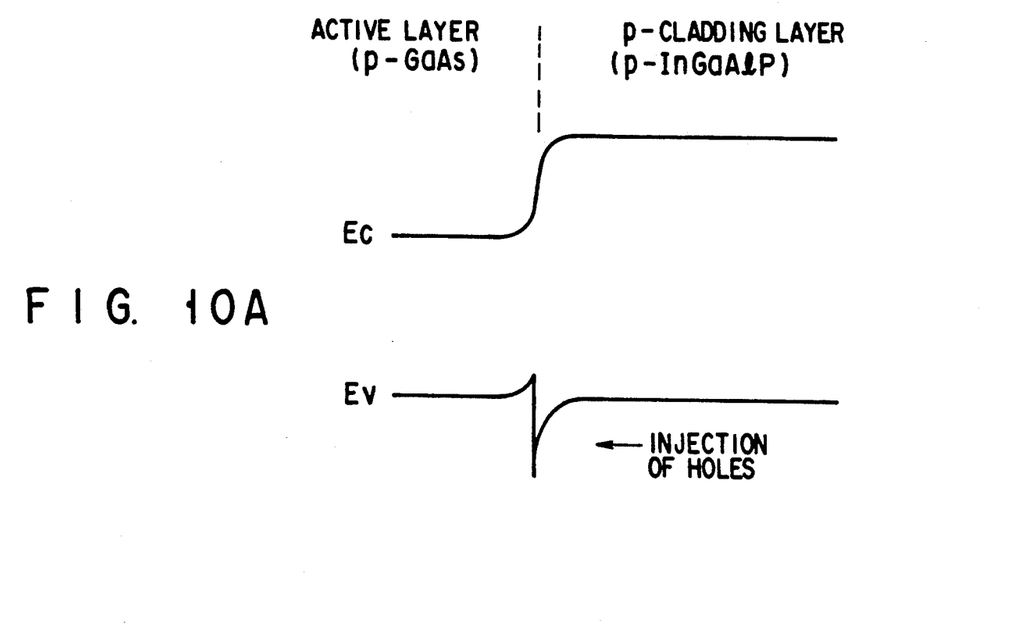
FIG. 10A and 10B are schematic energy band diagrams of active and p-type cladding layers.
Figure 10B:
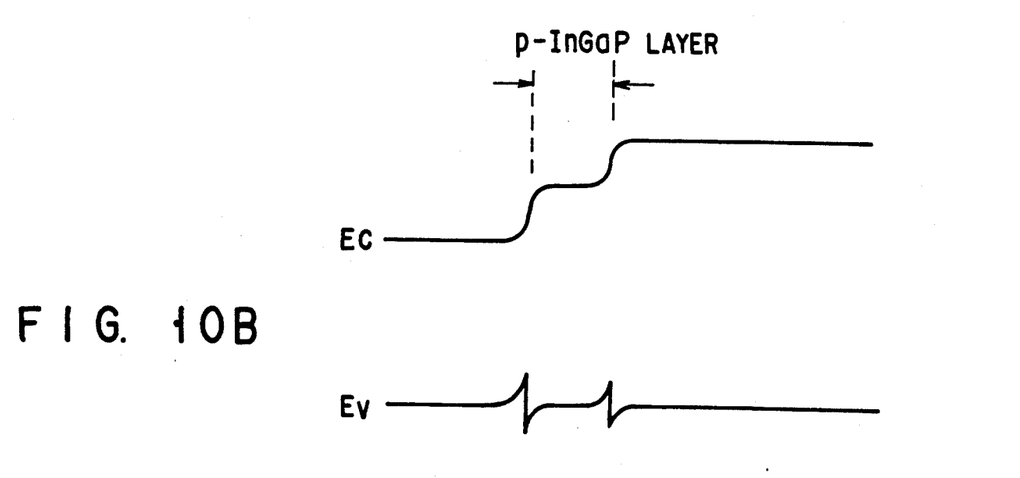

FIGS. 10A and 10B are energy band diagrams of the active layer and the p-type upper cladding layer. The bias is applied in the forward direction. As shown in FIG. 10A, when the active layer and the p-type upper cladding layer directly form a junction, a heterobarrier based on a large band gap difference appears to interfere with hole injection, so that the rise voltage and resistance of the element are increased, considerably degrading the element characteristics. This tendency becomes conspicuous especially when the band gap difference between the active and cladding layers exceeds 0.7 eV, thus increasing the resistance of the element.

As shown in FIG. 10B, when an InGaP layer is provided between the active layer and the p-type upper cladding layer, since InGaP has an intermediate band gap of the band gaps of GaAs and InGaAlP, the heterobarrier can be effectively lowered. For this reason, hole injection to the active layer is smoothly performed, and the heterobarrier does not interfere with hole injection. The relationship shown in the energy band diagrams of FIGS. 10A and 10B changes depending on the Al atomic ratios and the carrier concentrations of the respective layers and can be improved by setting the conductivity type of the active layer to the n type. However, since the InGaP layer can be provided with a good reproducibility and the As-P interface can be formed without Al, the InGaP layer is effective also to improve the reliability. In this example, the n-type InGaP layer is provided in addition to the p-type InGaP layer from the viewpoint of high reliability. In mode design, the n-type InGaP layer is also considered as an optical guide layer.

In this manner, the semiconductor laser shown in FIG. 9, in which between the active layer and the respective p-type cladding layers the InGaP layers having intermediate band gaps of the band gaps of the active layer and the corresponding p-type cladding layers are provided, continuously oscillated at a threshold current of 19 mA when the resonator length was 400 μm. The element resistance was 2.5 Ω, and the voltage was as low as 1.7 V even at 20 mW. The characteristic temperature did not change up to a temperature of 200° C. and was 215 K, which substantially coincided with the value determined by the temperature dependency of the gain of the active layer. This indicates that overflow of carriers injected from the active layer to the cladding layer is suppressed as designed.

As a result, continuous oscillation was observed at a temperature up to 300° C., and pulse oscillation was observed at a temperature up to 400° C. Regarding a high-output operation, according to the semiconductor laser in which asymmetric coating was performed, a maximum optical output of 150 mW was obtained. Regarding reliability, a stable operation of 10,000 hours or more was observed at 80° C. and 50 mW. In these results, no problem due to the As-based active layer and the P-based cladding layer was observed. It is estimated that interface deposition switching is performed very well by MOCVD, and that continuous growth is performed.

The present invention is not limited to the embodiments described above, and can be applied to, e.g., a structure using a GaAlAs active layer having a relatively high Al atomic ratio, a quantum well structure, and a structure positively employing distortion, as far as a sufficiently large band gap difference with respect to the cladding layer can be obtained. Furthermore, a layer containing a material, e.g., As, B, N, Zn, or Se, can be used as the cladding layer. The present invention is not limited to a semiconductor laser but can also be applied to a light-emitting diode having a double heterojunction structure. Various changes and modifications may be made without departing from the spirit and scope of the invention.

The present invention is not only limited to the embodiments employing the material system latticematching with GaAs substrate, but also can be applied to the material system lattice-matching with InP substrate. Furthermore, all the material constituting the cladding layer has unnecessarily high bandgap, but, a part of the cladding layer may be constituted by a high bandgap material. In this case, the high bandgap layer may have distortion.

As has been described above in detail, according to the present invention, a cladding layer having a sufficiently large band gap difference with respect to an active layer can be provided, and the temperature characteristics are greatly improved, thus realizing an excellent semiconductor light-emitting element that can be sufficiently used at a temperature of 300° C. or more.

Also, according to the present invention, factors interfering with hole injection by the presence of the heterobarrier based on the band gap difference between the active and cladding layers can be eliminated, and the element voltage can be decreased.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor light-emitting element comprising:
   a semiconductor substrate of a first conductivity type;
   a lower cladding layer formed on said semiconductor substrate, said lower cladding layer being composed of an InGaAlP-based compound of said first conductivity type;
   an active layer formed on said lower cladding layer, said active layer being composed of a material selected from a group consisting of GaAs, GaAlAs, and InGaAs; and
   a first upper cladding layer formed on said active layer, said first upper cladding layer being composed of said InGaAlP-based compound of a second conductivity type, wherein said InGaAlP-based compound is represented by a formula $In_y(Ga_{1-x}Al_x)_yP$, x being in the range of 0.3 to 0.7 and y being in the range of 0.45 to 0.55.

2. A semiconductor light-emitting element according to claim 1, wherein x is in the range of 0.5 to 0.7.

3. A semiconductor light-emitting element according to claim 1, wherein said semiconductor substrate of said first conductivity type is composed of GaAs.

4. A semiconductor light-emitting element according to claim 1, wherein a stripe-shaped upper cladding layer is formed on said first upper cladding layer and is composed of a same material as that of said first upper cladding layer.

5. A semiconductor light-emitting element according to claim 1, wherein a stripe-shaped upper cladding layer is formed on said first upper cladding layer and is composed of a same material as that of said first upper cladding layer, and wherein a current narrowing layer of said first conductivity type composed of GaAs is formed on a side portion of said stripe-shaped upper cladding layer.

6. A semiconductor light-emitting element according to claim 1, wherein a current narrowing layer of said first conductivity type composed of GaAs and having a stripe-shaped opening formed therethrough is formed on said first upper cladding layer.

7. A semiconductor light-emitting element according to claim 1, wherein said first upper cladding layer and said lower cladding layer are formed via metal organic chemical vapor deposition.

8. A semiconductor light-emitting element comprising:
   a compound semiconductor substrate;
   a double-hetero structure formed on said compound semiconductor substrate and composed of a first cladding layer of a first conductivity type, a second cladding layer of a second conductivity type, and an active layer of said first conductivity type interposed between said first cladding layer and said second cladding layer,
   wherein said active layer, said first cladding layer, and said second cladding layer are composed of a combination of materials such that a valence band difference between said active layer and at least one of said first cladding layer and said second cladding layer is larger than a conduction band difference therebetween, wherein said active layer is composed of a member selected from a group consisting of GaAs, GaAlAs, and InGaAs, and wherein said first cladding layer and said second cladding layer are composed of a material represented by a formula $In_y(Ga_{1-x}Al_x)_yP$, x being in the range of 0.3 to 0.7 and y being in the range of 0.45 to 0.55.

9. A semiconductor light-emitting element according to claim 8, where x is in the range of 0.5 to 0.7.

10. A semiconductor light-emitting element according to claim 8, wherein said compound semiconductor substrate is of said first conductivity type and is composed of GaAs.

11. A semiconductor light-emitting element according to claim 8, wherein a stripe-shaped cladding layer is formed on said second cladding layer and is composed of a same material as that of said second cladding layer.

12. A semiconductor light-emitting element according to claim 8, wherein a stripe-shaped cladding layer is formed on said second cladding layer and is composed of a same material as that of said second cladding layer, and wherein a current narrowing layer of said first conductivity type composed of GaAs is formed on a side portion of said stripe-shaped cladding layer.

13. A semiconductor light-emitting element according to claim 8, wherein a current narrowing layer of said first conductivity type composed of GaAs and having a stripe-shaped opening formed therethrough is formed on said second cladding layer.

14. A semiconductor light-emitting element according to claim 8, wherein said first cladding layer and said second cladding layer are formed via metal organic chemical vapor deposition.

15. A semiconductor light-emitting element comprising:
   a compound semiconductor substrate;
   a double-hetero structure formed on said compound semiconductor substrate and composed of a first cladding layer of a first conductivity type, a second cladding layer of a second conductivity type, and an active layer of said first conductivity type interposed between said first cladding layer and said second cladding layer, wherein said active layer, said first cladding layer, and said second cladding layer are composed of a combination of materials such that a valence band difference between said active layer and at least one of said first cladding layer and said second cladding layer is larger than a conduction band difference therebetween; and
   an intermediate band gap layer interposed between said active layer and said second cladding layer, said intermediate band gap layer having an intermediate band gap of band gaps of said active layer and said second cladding layer, wherein said active layer is composed of a material selected from a group consisting of GaAs, GaAlAs, and InGaAs, and wherein said first cladding layer and said second cladding layer are composed of a material represented by a formula $In_y(Ga_{1-x}Al_x)_yP$, x being in the range of 0.3 to 0.7 and y being in the range of 0.45 to 0.55.

16. A semiconductor light-emitting element according to claim 15, wherein said intermediate band gap layer is composed of a material represented by a formula $In_pGa_{1-p}P$, where p is in the range of 0.3 to 0.7.

17. A semiconductor light-emitting element according to claim 15, where x is in the range of 0.3 to 0.7.

18. A semiconductor light-emitting element according to claim 15, wherein said compound semiconductor substrate is of said first conductivity type and is composed of GaAs.

19. A semiconductor light-emitting element according to claim 15, wherein a stripe-shaped cladding layer is formed on said second cladding layer and is composed of a same material as that of said second cladding layer.

20. A semiconductor light-emitting element according to claim 15, wherein a stripe-shaped cladding layer is formed on said second cladding layer and is composed of a same material as that of said second cladding layer, and wherein a current narrowing layer of said first conductivity type composed of GaAs is formed on a side portion of said stripe-shaped cladding layer.

21. A semiconductor light-emitting element according to claim 15, wherein a current narrowing layer of said first conductivity type composed of GaAs and having a stripe-shaped opening formed therethrough is formed on said second cladding layer.

22. A semiconductor light-emitting element according to claim 15, wherein said first cladding layer and said second cladding layer are formed via metal organic chemical vapor deposition.

23. A semiconductor light-emitting element comprising:
   a compound semiconductor substrate;
   a double-hetero structure formed on said compound semiconductor substrate and composed of a first cladding layer of a first conductivity type, a second cladding layer of a second conductivity type, and an active layer of said first conductivity type interposed between said first cladding layer and said second cladding layer, wherein said active layer, said first cladding layer, and said second cladding layer are composed of a combination of materials such that a valence band difference between said active layer and at least one of said first cladding layer and said second cladding layer is larger than a conduction band difference therebetween;
   a first intermediate band gap layer interposed between said active layer and said second cladding layer, said first intermediate band gap layer having an intermediate band gap of band gaps of said active layer and said second cladding layer; and
   a second intermediate band gap layer interposed between said active layer and said first cladding layer, said second intermediate band gap layer having an intermediate band gap of band gaps of said active layer and said first cladding layer, wherein said active layer is composed of a material selected from a group consisting of GaAs, GaAlAs, and InGaAs, and wherein said first cladding layer and said second cladding layer are composed of a material represented by a formula $In_y(Ga_{1-x}Al_x)_yP$, x being in the range of 0.3 to 0.7 and y being in the range of 0.45 to 0.55.

24. A semiconductor light-emitting element according to claim 23, wherein said first intermediate band gap layer and said second intermediate band gap layer are composed of a material represented by a formula $In_pGa_{1-p}P$, where p is in the range of 0.3 to 0.7.

25. A semiconductor light-emitting element according to claim 23, where x is in the range of 0.5 to 0.7.

26. A semiconductor light-emitting element according to claim 23, wherein said compound semiconductor substrate is of said first conductivity type and is composed of GaAs.

27. A semiconductor light-emitting element according to claim 23, wherein a stripe-shaped cladding layer is formed on said second cladding layer is composed of a same material as that of said second cladding layer.

28. A semiconductor light-emitting element according to claim 23, wherein a stripe-shaped cladding layer is formed on said second cladding layer is composed of a same material as that of said second cladding layer, and wherein a current narrowing layer of said first conductivity type composed of GaAs is formed on a side portion of said stripe-shaped cladding layer.

29. A semiconductor light-emitting element according to claim 23, wherein a current narrowing layer of said first conductivity type composed of GaAs and having a stripe-shaped opening formed therethrough is formed on said second cladding layer.

30. A semiconductor light-emitting element according to claim 23, wherein said first cladding layer and said second cladding layer are formed via metal organic chemical vapor deposition.

* * * * *